United States Patent
Montauti et al.

[11] Patent Number: 6,060,342
[45] Date of Patent: May 9, 2000

[54] CIRCUIT PACKAGING FOR MILLIMETER-WAVE COMPONENTS

[75] Inventors: Fabrizio Montauti, San Jose; Victor Fernandez, Campbell, both of Calif.

[73] Assignee: P-Com, Incorporated, Campbell, Calif.

[21] Appl. No.: 09/056,390

[22] Filed: Apr. 6, 1998

[51] Int. Cl.[7] .................................................. H01L 21/44
[52] U.S. Cl. .......................... 438/125; 438/118; 438/121
[58] Field of Search .................................... 438/121, 125, 438/118; 257/704

[56] References Cited

U.S. PATENT DOCUMENTS

| | | | |
|---|---|---|---|
| 4,769,272 | 9/1988 | Byrne et al. | 438/126 |
| 5,168,344 | 12/1992 | Ehlert et al. | 257/704 |
| 5,596,171 | 1/1997 | Harris et al. | 257/704 |
| 5,742,007 | 4/1998 | Kornowski et al. | 257/704 |
| 5,750,926 | 5/1998 | Schulman et al. | 257/704 |
| 5,804,870 | 9/1998 | Burns | 257/704 |

*Primary Examiner*—Kevin M. Picardat
*Attorney, Agent, or Firm*—Skjerven, Morrill, MacPherson, Franklin & Friel, LLP; David E. Millers; Gary J. Edwards

[57] ABSTRACT

A module for a millimeter-wave component having environmentally sensitive components, such as with chip and wire technology, is described which does not require that the entire module be hermetically sealed against the outside elements in order to protect the environmentally sensitive component. A cap is placed over the environmentally sensitive component in order that the vulnerable component itself is protected from the external environment. The less-vulnerable remainder of the millimeter-wave module can withstand limited exposure to environmental conditions and, therefore, is not necessarily sealed.

3 Claims, 7 Drawing Sheets

Tripler/Amplifier Circuit Diagram

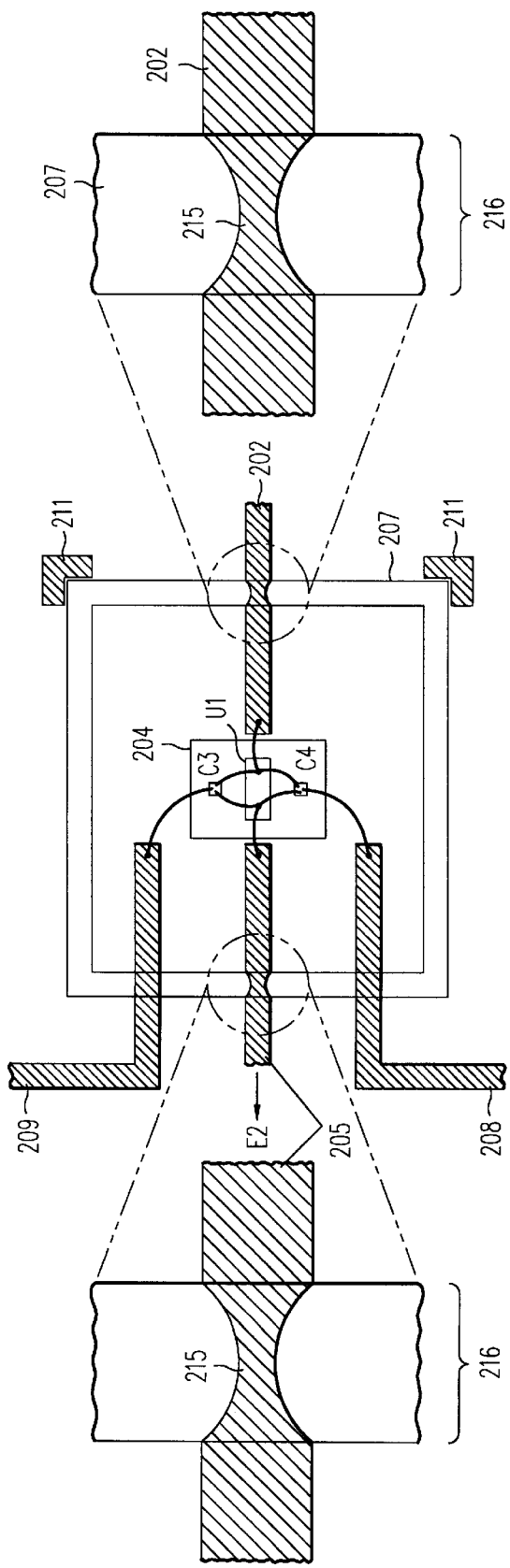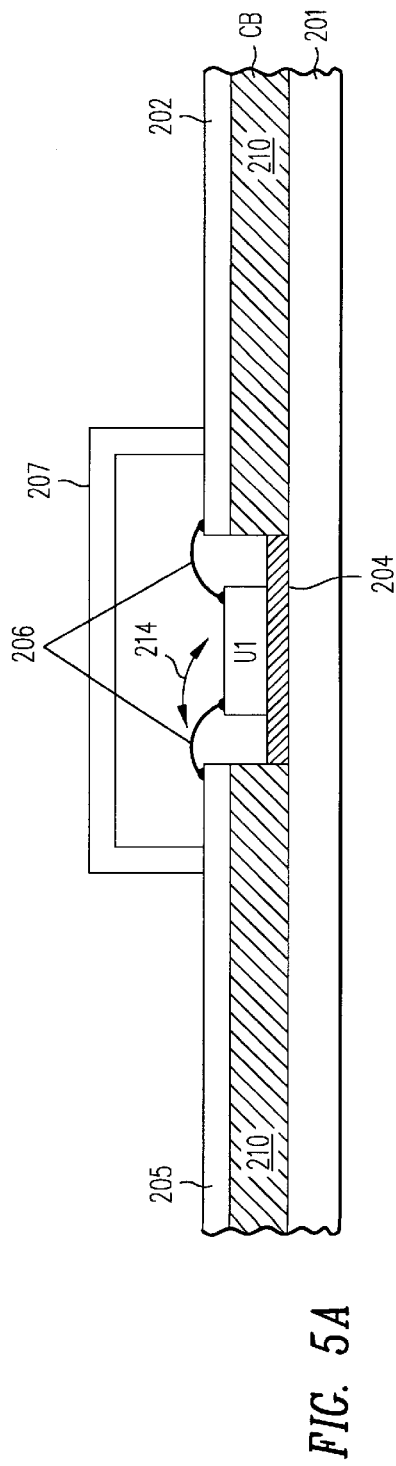
FIG. 5C
FIG. 5B
FIG. 5D
FIG. 5A

CIRCUIT PACKAGING FOR MILLIMETER-WAVE COMPONENTS

BACKGROUND

1. Field of the Invention

This invention relates to the packaging of a millimeter-wave module containing chip and wire technology or other components that require protection from the environment.

2. Background

Use of wireless technologies employing frequencies above 20 GHz (millimeter-wave technologies) are increasing. Cellular telephone and pager systems are among the most notable applications of wireless technologies.

Components in millimeter-wave systems often utilize chip and wire technology. Chip and wire technology refers to the use of a naked integrated circuit chip that is electrically and mechanically attached (soldered) to a conducting carrier where small wires bonded to pads directly on the integrated chip make connections to the chip. The chip itself is not packaged, i.e., it is an open device. Many of the electrical components used in these millimeter-wave applications are mounted on microwave antenna towers and are exposed to the elements. These components, in spite of the sensitive chip and wire technology, need to be durable.

A typical microwave transmitter system 100 is shown in FIG. 1. In FIG. 1, a base-band source of information 101 feeds a signal to be transmitted to a modulator 102. The output signal from modulator 102 is inputted to a tripler/amplifier module 103. Tripler/amplifier module 103 generates a signal having amplitude and frequency greater than the amplitude and frequency of the signal from modulator 102. Typically, the frequency of the input signal to tripler/amplifier module 103 ranges from 12 to 13.3 Ghz and the frequency of the signal from the tripler/amplifier module 103 is in the frequency range of 36 to 42 GHz (nominally 38 GHz).

The output signal from tripler/amplifier module 103 is inputted to a filter/diplexer 104 which outputs a signal to a microwave antenna 105 for broadcast. The same microwave antenna 105 receives incoming microwave signals and filter/diplexer 104 routes the incoming signal to a receiver 106. Receiver 106 receives a nominal 38 GHz signal and outputs a signal compatible with the format of base-band information 101. Many modules, especially those that utilize active microwave components such as the chip and wire technology, must be tightly sealed to prevent damage of sensitive components. For example, moisture from the surrounding atmosphere can damage or affect the operation of tripler/amplifier module 103 of FIG. 1.

FIG. 2 shows tripler/amplifier module 103. Tripler/amplifier module 103 is one that contains a monolithic microwave integrated circuit (MMIC) amplifier U1. MMIC U1 is a naked GaAs integrated circuit chip which is easily damaged if exposed to the elements (dust, pollution, moisture, solvents etc.). In addition, electrical connections to pads of MIMIC U1 (for power, biasing, etc.) are delicate and also easily damaged if exposed to the atmosphere.

Typically, modules such as tripler/amplifier module 103 are enclosed in a hermetically sealed housing 118 having hermetically sealed terminals. For example, tripler/amplifier module 103 has an RF input 111, a microwave output 115, a ground connection 112, a negative DC bias input 113, and a positive DC bias input 114. Tripler/amplifier 103 may also include other hermetically sealed inputs and outputs not shown in FIG. 2. The housing 118 of the module includes a base section 116 and a lid section 117 that encloses the internal circuitry of the tripler/amplifier module 103.

In order to protect the naked MMIC chip U1, the entire module 103 is sealed. The lid 117 is sealed to the base 116 and all of the inputs to the interior of the module (111 through 115) are hermetically sealed. Even the coaxial tube to waveguide connection 111 and the output waveguide connection 115 are sealed. This causes each of these connectors to be high cost. The total manufacturing cost of the tripler/amplifier module 103 is therefore high.

In addition, if the tripler/amplifier 103 fails, it is typically discarded because components cannot be repaired without breaking the hermetic seal. Repairs on the hermetically sealed prior art tripler/amplifier module 103 are, therefore, impractical.

SUMMARY OF THE INVENTION

According to this invention, integrated circuits and other components which could be damaged by exposure to the environment are individually covered with a cap. Insertion of the cap over the sensitive components protects the component without requiring that the entire module be sealed.

The individual protection for a sensitive component and subsequent relaxation in the sealing requirements for the remainder of the module significantly reduces the cost of the module. Although the cost of a module, such as the tripler/amplifier module, is reduced and the module is no longer hermetically sealed, the performance of the module remains the same as the prior-art hermetically sealed module. In addition, because a module produced according to this invention need not be fully sealed, the module can be disassembled for repair.

In general, a millimeter-wave module has a circuit board assembly and an environmentally sensitive component mounted on the circuit board assembly. A cap is placed over the environmentally sensitive component so that the integrated circuit is fully enclosed in an enclosure bounded by the cap and the circuit board assembly.

In particular, a tripler/amplifier module manufactured according to this invention comprises a microwave circuit board assembly having a conducting carrier, a dielectric circuit board mounted on the conducting carrier, and conducting strips on top of the dielectric circuit board (opposite the conducting carrier). The dielectric circuit board has a chip access hole where a naked monolithic microwave integrated chip (MMIC) can be mounted with one surface in electrical contact with the conductive carrier. The MMIC has pads where wire connections are made between the MMIC and the conducting strips on the dielectric circuit board.

The chip access hole and the MMIC chip are covered with a cap mounted to the circuit board assembly in order to protect the naked MMIC chip from the environment. The cap needs to be large enough to enclose all of the wires connected to the MMIC chip.

DESCRIPTION OF THE FIGURES

FIG. 5A shows a cross-section of the microwave circuit board assembly of FIG. 4A in the vicinity of the MMIC chip and a cap according to the present invention.

FIGS. 5B, 5C and 5D show the microstrip lines to the MMIC chip and a coupling impedance transformer.

Use of the same reference symbols in different figures indicates similar or identical items.

DETAILED DESCRIPTION

In accordance with the present invention, a cap is placed over an integrated circuit chip or other sensitive component of a millimeter-wave module. The presence of the cap protects the component from the environment. The module itself, therefore, does not need to be sealed from the environment. The resulting module has the same performance characteristics as prior-art modules, which are hermetically sealed from the environment, without the additional costs of sealing the housing and the electrical connections through the module housing.

In addition, a module produced according to this invention may be easily opened for repair and resealed. Prior-art modules, in contrast, are discarded.

Figure 1:
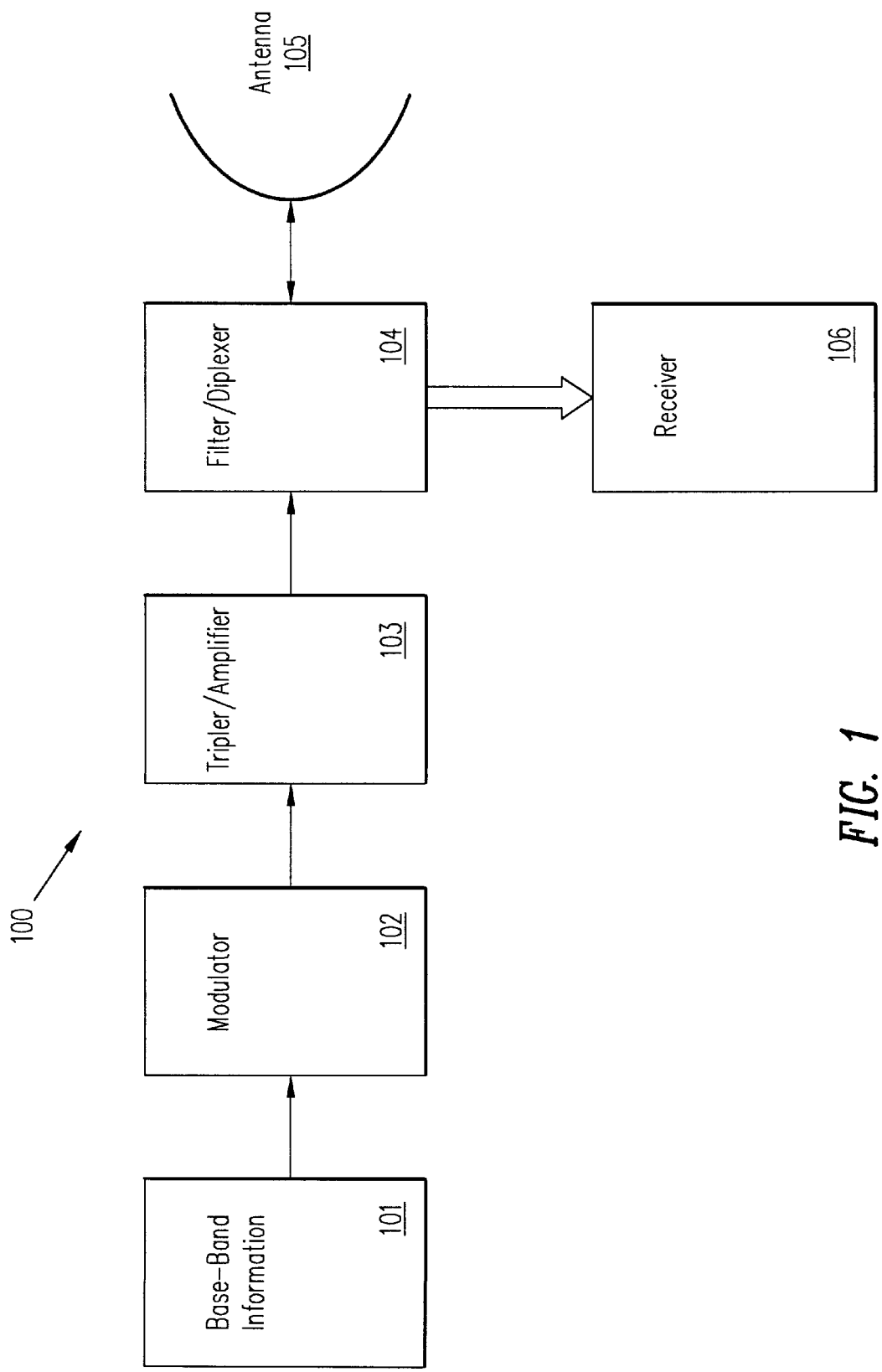
FIG. 1 shows a block diagram of a microwave transmitter/receiver known in the art.
Figure 2:
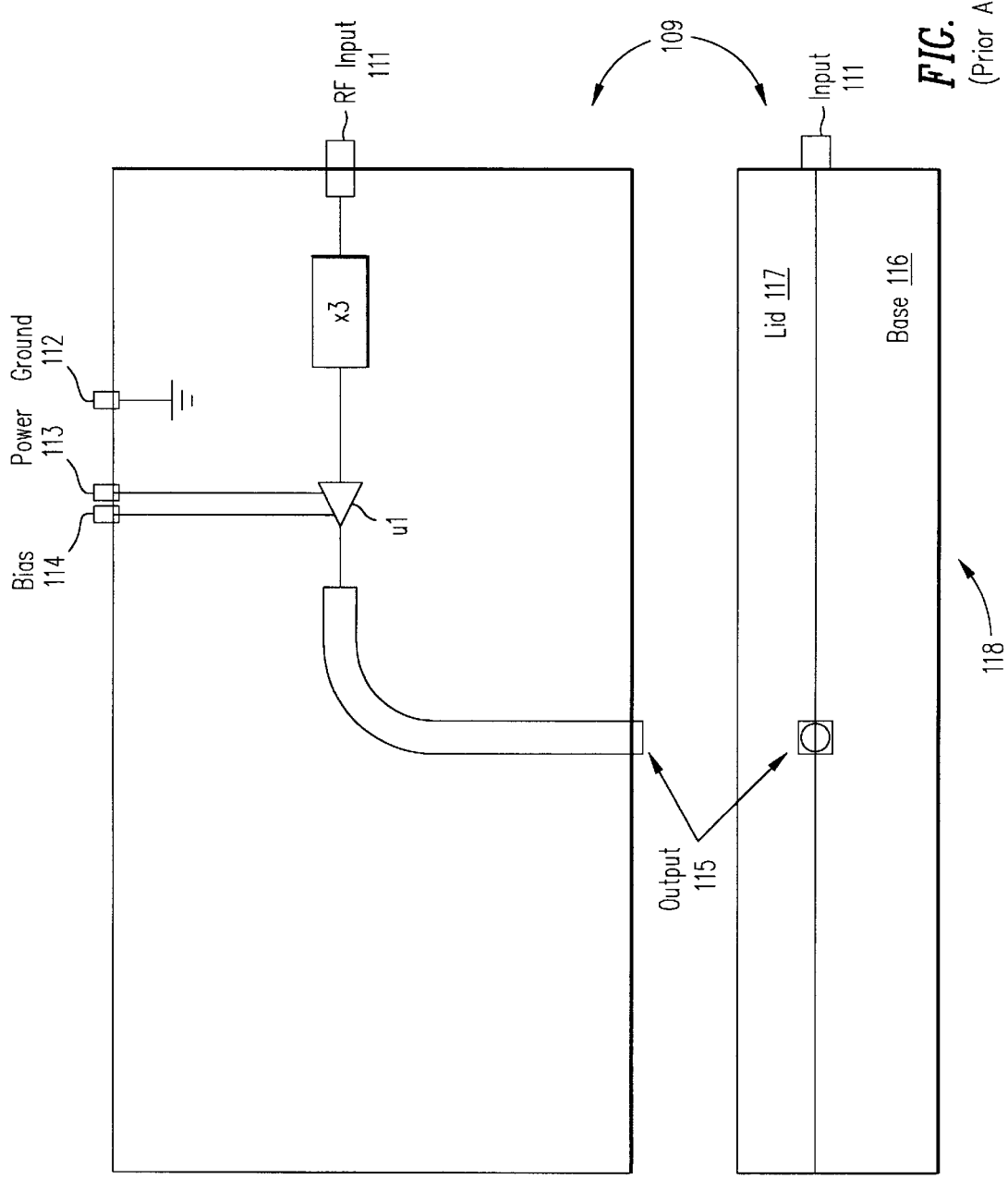
FIG. 2 shows a known tripler/amplifier module used in the transmitter/receiver of FIG. 1.

The following discussion describes a tripler/amplifier module according to an embodiment of the present invention. The tripler/amplifier module described here is a direct replacement for the prior-art tripler/amplifier module 103 shown in FIG. 1.

Figure 3:
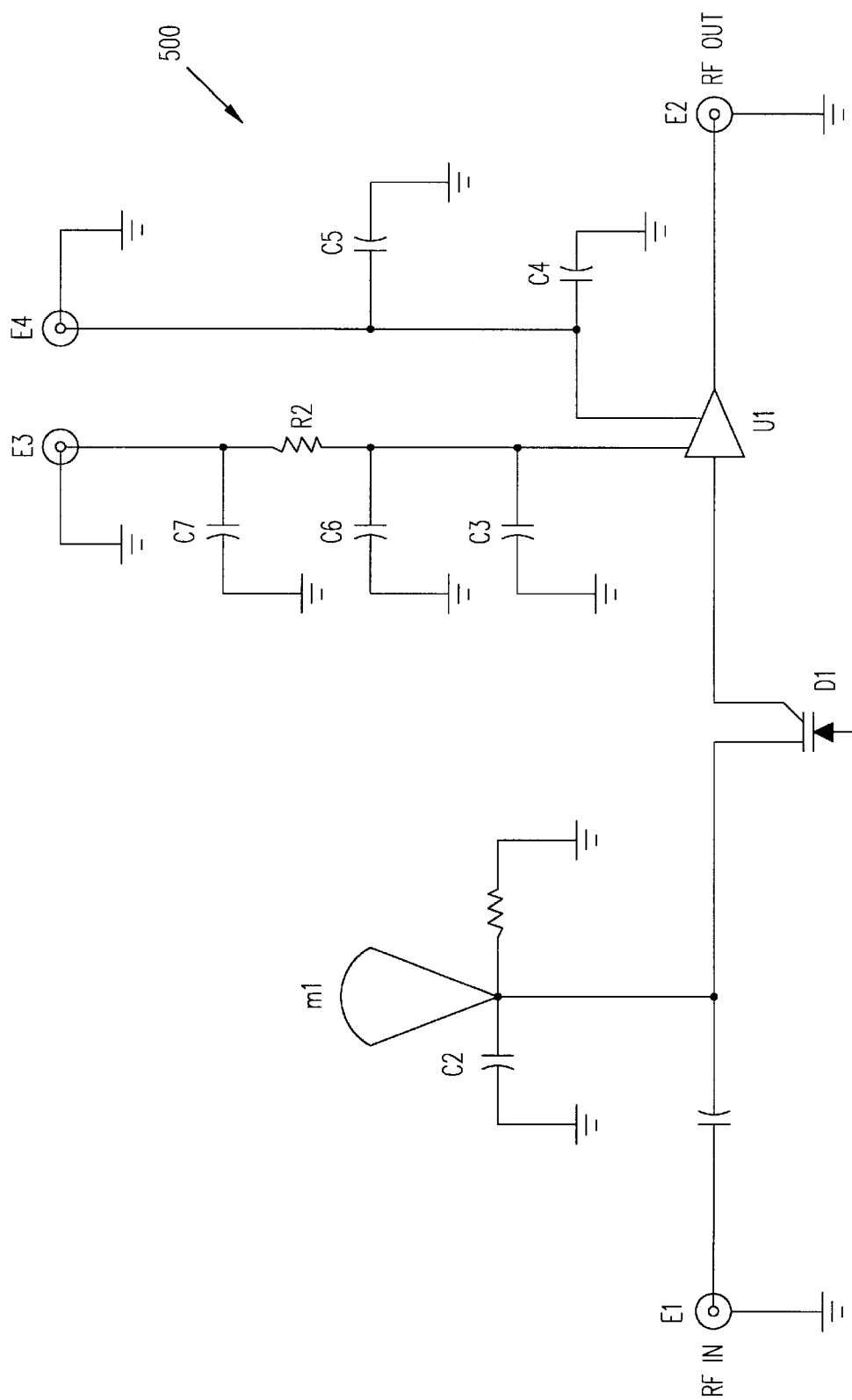
FIG. 3 shows a circuit diagram for a tripler/amplifier module used in the transmitter section of a transmitter/receiver in accordance with an embodiment of the invention.

FIG. 3 shows the circuit diagram of a tripler/amplifier module 500. Module 500 has external connections to the microwave circuit shown by including terminal E1 for the RF input signal; a terminal E2 for the tripled and amplified output signal; a terminal E4 for the positive bias signal supplied to a monolithic microwave integrated circuit (MIMIC) U1; and terminal E3 for a negative bias signal for the MIMIC U1. In module 500, a varactor D1 and accompanying circuitry generate a signal RF out having three times the frequency of input signal RF in. The accompanying circuitry, comprising capacitors C2, C1, resistor R1 and resonant microwave stub M1, also interfaces the input signal with varactor D1 and MMIC amplifier U1. Module 500 is, therefore, matched to receive the input signal and perform the tripling and amplification functions. In the preferred embodiment, MMIC U1 is HP amplifier chip HMMC-5040. Also, in the preferred embodiment, varactor D1 is MA/COM varactor chip MA48701.

Capacitors C7, C6, C3 and resistor R1 stabilize the bias signal input to MIMIC U1. Similarly, capacitors C5 and C4 stabilize the power signal input to MIMIC U1.

Figure 4A:
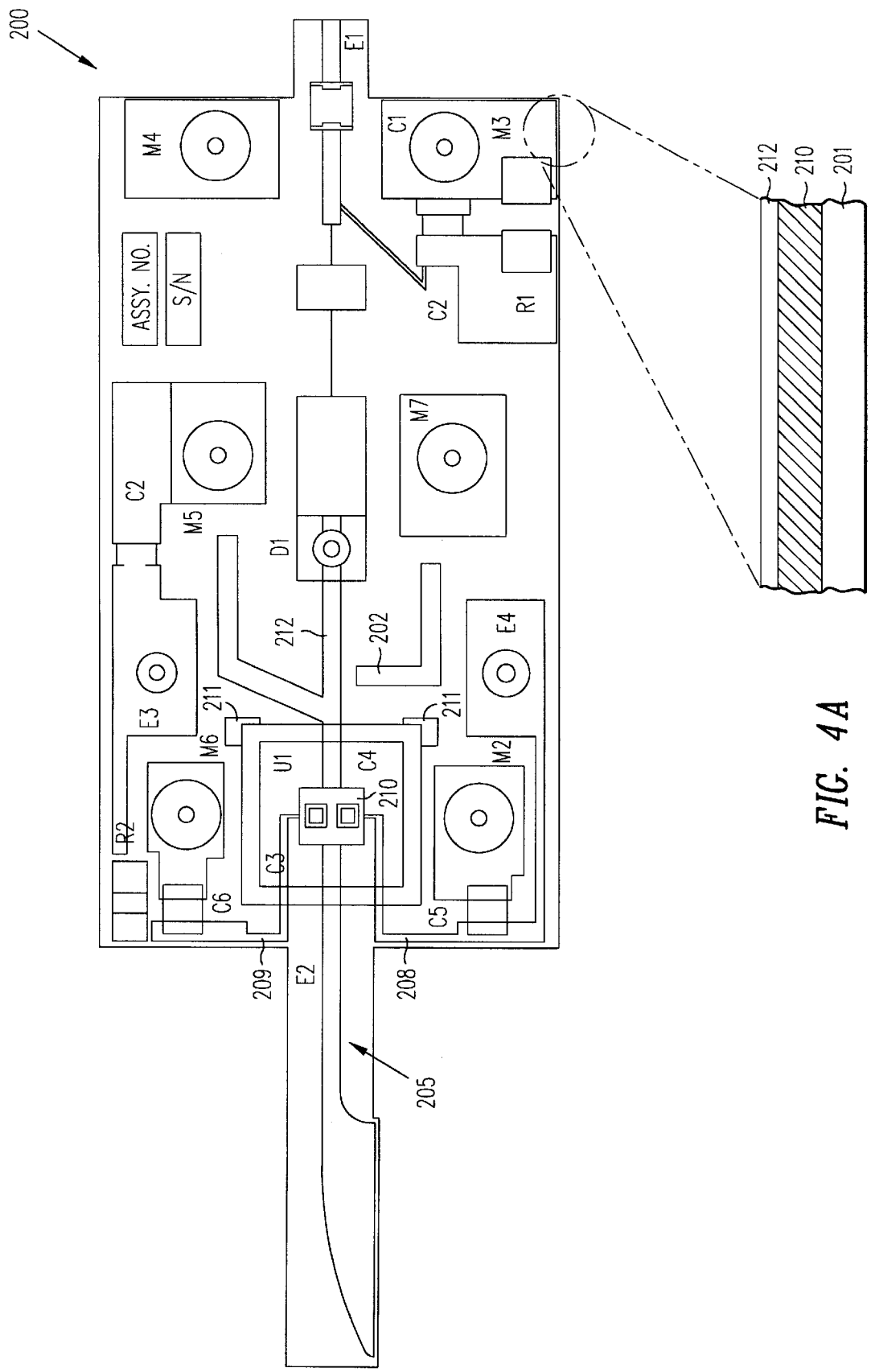
FIG. 4A shows a microwave circuit board assembly for the circuit diagram shown in FIG. 3.

FIG. 4A shows the lay out of the circuit shown in FIG. 3 on a circuit board assembly 200. Circuit board assembly 200 comprises a circuit board 210 mounted on a conducting carrier 201. Circuit board 210 comprises a dielectric material, which preferably is DUROID™ 5880 produced by Rogers Corp. The thickness of the DUROID™ circuit board material is typically 10 mils (0.010 inches). Conducting carrier 201 on which circuit board 210 is mounted is, in the preferred embodiment, 10 mil (0.010 inches) thick copper sheet. Microstrip conducting lines and other conducting strips 212 are formed on circuit board 210 opposite the conducting carrier 201 and are patterned to form portions of the microwave circuit shown in FIG. 3. In an exemplary embodiment, the microstrip lines and other conducting strips 212 are formed with gold.

The input signal to the tripler/amplifier module is coupled to the microstrip conducting lines formed on the top of the circuit board. The microstrip conducting lines form input and output terminals. Terminal E1 is for an input signal of frequency 12 to 13.3 GHz; while the tripled and amplified output signal is on terminal E2. Input terminals E3 and E4 supply positive and negative biasing to the MMIC chip U1, as is shown in the circuit diagram of FIG. 3. Further connections to the circuit board are supplied by terminals M2, M3, M4, M5, M6 and M7. These terminals provide a ground for the circuit. Varactor D1 is centrally mounted on the microwave circuit board assembly 200.

The tripler function is accomplished in the portion of microwave circuit board assembly 200 that includes terminal E1, varactor D1 and components from terminal E1 up to MMIC U1. Some of the circuitry in this portion of microwave circuit board assembly 200 serves the further function of impedance matching to varactor D1 and to MMIC U1. MMIC U1 is an amplifier chip and amplifies the frequency tripled input signal. In tripler/amplifier module 500, the amplified and tripled signal present on terminal E2 is coupled into a coaxial tubular wave guide using an impedance transformer (not shown).

Figure 4B:
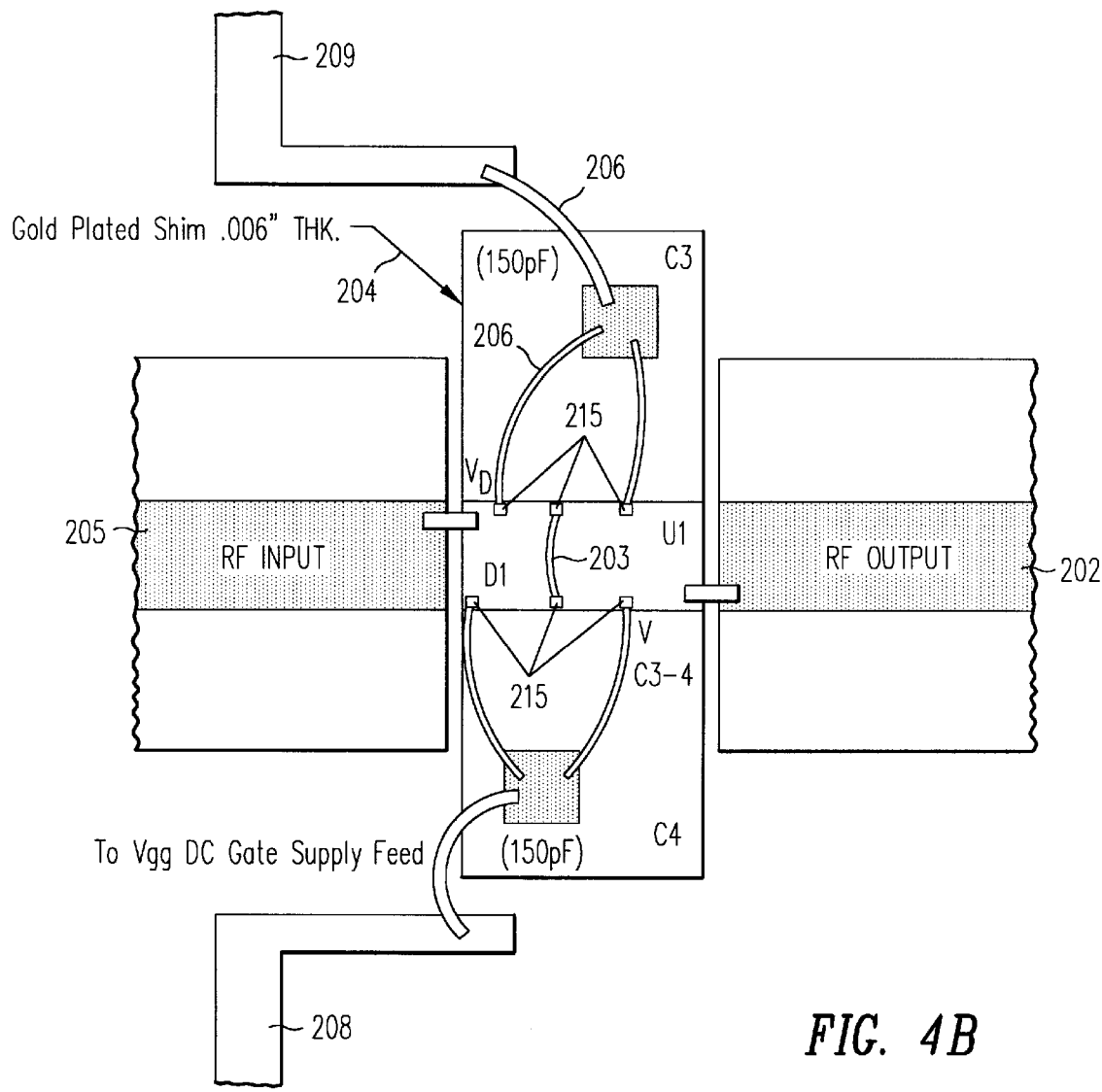
FIG. 4B shows a magnified view of a portion of the circuit board assembly lay-out of FIG. 4A including a MMIC chip and wire connections to the circuit board assembly.

FIG. 4B shows an expanded portion of microwave circuit board assembly 200 that includes the naked MMIC chip U1. A conducting epoxy attaches MMIC U1 to a gold plated shim 204 and gold plated shim 204 to conducting carrier 201 underlying dielectric circuit board 210 so that MMIC U1 is in electrical contact with conducting carrier 201. Other methods of attaching MMIC U1 to shim 204 and shim 204 to the conducting carrier 201 or of forming the microwave circuit with MMIC U1 will be obvious to one skilled in the art.

Circuit board 210 has a chip access 214 which exposes the top of MMIC U1 to the top of circuit board 210 where conducting strips 212 of the microwave circuit resides. Chip access 214 is a hole in circuit board 210 large enough to contain MMIC U1 without MMIC U1 contacting circuit board 210. Connections to MMIC U1 are made with 20-micron (0.7-mil) gold wires 206 bonded between microstrips on the top of circuit board 210 and pads 215 on MMIC U1.

The conducting strip layout shown on the circuit board assembly 200 in FIG. 4A also includes cap guides 211. The cap guides assist in aligning a cap 207 on the circuit board 210 when the cap is mounted.

FIG. 4B shows connections between conducting strip 209 and capacitor C3; between capacitor C3 and pads 215 on MMIC U1; between conducting strip 208 and capacitor C4; between capacitor C4 and pads 215 on MMIC U1; between microstrip 205 and pads 215 on MMIC U1; and between microstrip 202 and pads 215 on MMIC U1. Capacitors C3 and C4 are mounted on gold plated shim 204 along with MMIC U1. Each of the pads 215 on MMIC U1 is a distinct input or output from MMIC U1 amplifier chip. FIG. 4B also shows a jumper wire 203 between two of the pads 215 on the MMIC U1.

The 20-micron gold wires 203 and 206 are ball-bonded to the respective conducting strips 202, 205, 208, and 209, capacitors C3 and C4, and respective pads 215 on MMIC U1 using a ball-bonding technique. The ball-bonding technique involves applying thermal compression to the wire and the conductor to which the wire is to be bonded. The combination of heat and vibration bonds the wire to the conductor.

Figure 4C:
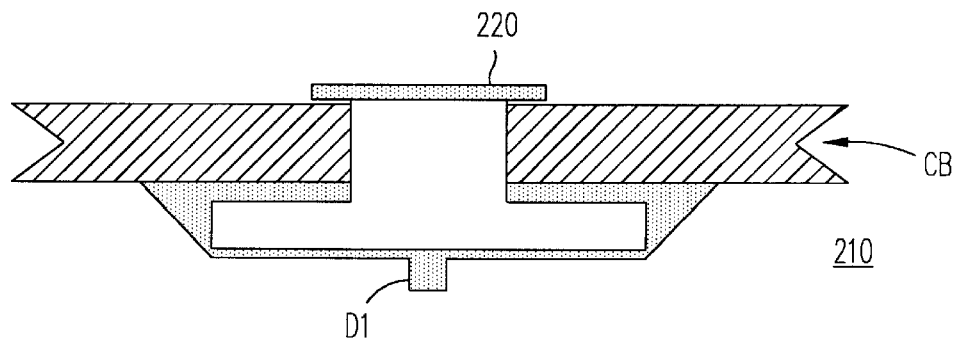
FIG. 4C shows a cross section of diode D1 mounted in the microwave circuit board assembly of FIG. 4A.

FIG. 4C shows the mounting of varactor D1 into microwave circuit board assembly 200. Varactor D1 is soldered to the bottom of circuit board 210 such that a portion is presented to the side of circuit board 210 which has conducting strips 212. A conducting strap 220 is soldered to the presented portion of varactor D1 on the side of circuit board 210 with conducting strips 212. Conducting strap 220 connects to microstrips 212.

FIG. 5A shows a cross section of circuit board assembly 200, MMIC U1, and a cap for component protection according to the present invention. As was described with FIG. 4A and FIG. 4B, dielectric circuit board 210 is mounted on metallic carrier 201. MMIC U1 is epoxied to shim 204 which is epoxied to conducting carrier 201 and sits within a chip access 214 in circuit board assembly 200 so that there is access to the top surface of MMIC U1 from the top of circuit board 210.

Microstrip 202 carries the tripled input signal while microstrip 205 carries the output signal of MMIC U1. Various electrical connections to MMIC U1 are as shown in FIG. 4B as well as in FIG. 5B.

Cap 207 is placed over the area with MMIC U1 such that MMIC U1 is protected from exposure to the elements. Cap 207 may be constructed from a number of dielectric materials including glass, fused silica, ceramic materials, and plastic materials. The choice of material for cap 207 is influenced by the need for a material with the lowest dielectric constant possible (ideally 1) and by cost. A low dielectric constant material reduces the effects that the additional dielectric cap material present in the vicinity of microwave circuit board assembly 200 has on the tuning of the microwave circuit. In the preferred embodiment, a plastic material was chosen because of it's low dielectric constant (namely 2.3) and because plastic is relatively inexpensive. Several techniques may be used to mount cap 207 in place over MMIC chip U1. There are several factors to consider when choosing a mounting method. First, cap 207 and the results of the mounting method need to be nonconductive to avoid shorting conductive strips 212 on the printed circuit board 210 and to minimize influences on the microwave circuit in microwave circuit assembly 200. Second, the mounting method must provide sufficiently reliable adhesion between cap 207 and printed circuit board 210 so that MMIC U1 and the surrounding area remains protected throughout the lifetime of the module. Third, the mounting method should be inexpensive and quick. Finally, any materials used must not damage MMIC U1 during manufacture of module 500 or later use of module 500. Even though MMIC U1 is covered by a passivation layer, silicon nitride in the HP MMC5040 chip, certain solvents present in epoxy materials may react with the passivation layer and cause damage to MMIC U1. Some epoxies may seep into MMIC U1 and damage the chip. Seepage may occur during manufacture of module 500 or later, as a result of heating, during use of module 500.

One method of attaching cap 207 is simply to use a non-conductive epoxy. The epoxy is applied to the bottom of cap 207 and to circuit board 200, and cap 207 is pressed on, heated and held in place while the epoxy cures. Cap 207 may be produced with the epoxy glue already in place. Another epoxy designed specifically for plastic materials may also be used. In addition, TAK PAK™ has been used in testing to hold the cap in place.

Cap 207 also must be physically large enough to fully cover the area containing MMIC U1 and chip access 214. The physical space between the top of cap 207 and the top of MMIC U1 chip must be large enough that cap 207 does not physically affect wires 203, 206 and MMIC U1. In the preferred embodiment, cap 207 is about 5 mm wide by 10 mm long and 2 to 3 mm deep. In practice, cap 207 can be of any size or shape that covers MMIC U1. The environmentally sensitive component, MMIC U1, resides within an enclosure defined by circuit board assembly 200 and cap 207. Cap 207, although not necessarily providing a hermitic seal for the chip, protects the chip from the outside environment.

The presence of dielectric cap 207 affects the tuning of the microwave circuit. In particular, adjustments must be made to the environment of the circuit in order to re-optimize the functioning of the microwave circuit. Changes in cap material, cap dimensions, or epoxy materials may further change the tuning of the microwave circuit.

FIG. 5B shows a top view of cap 207 and the area containing MMIC U1. Cap 207 is bonded to the tops of microstrips 202 and 205 as well as to electrical conductors 209 and 208 so that conductors 202, 205, 208 and 209 pass beneath a cap wall 216. Cap 207, circuit board 210 and conducting carrier 201 completely enclose capacitors C3 and C4, the gold plated shim 204, MMIC U1, and wires 206. MMIC U1 resides in the chip access 214 in the circuit board assembly 200. Other embodiments may have sensitive components not residing within an access such as chip access 214. In that case, cap 207 is bonded to circuit board assembly 200 so as to cover the sensitive component and a surrounding area.

Where cap 207 is bonded to microstrips 202 and 205, microstrip 202 and 205 becomes stripline and an impedance transformer 215 needs to be provided in the cap area to match the impedance outside the cap wall 216 with the impedance under cap wall 216. Impedance transformer 215 takes the form of an alteration in the dimension of the conducting strip beneath the cap wall 216. FIGS. 5C and 5D show a narrowing of the conducting strip 202 and 205 respectively as they pass under the cap wall 216. This narrowing, acting as an impedance transformer, matches the impedance of the microstrip under cap wall 216 with portions of the microstrip not under cap wall 216. The dimensions of impedance transformer 215 depends on the material of cap 207. In one embodiment, impedance transformer 215 is a narrowing to about 23 mils (0.023 inches) of the normally 30 mils (0.030 inches) microstrip for a length of about 20 mils (0.020 inches) under cap wall 216. Without impedance transformer 215 in the vicinity of cap wall 216, the tuning of the microwave circuit may deteriorate sufficiently to detrimentally affect the stability of the microwave circuit.

Microwave circuit board assembly 200 shown in FIGS. 4A, 4B, 4C, 5A, 5B, 5C and 5D is mounted on a base and covered with a lid to form the tripler/amplifier module. The base and lid form a housing for the tripler/amplifier module. Electrical connections to the microwave circuit are made through the base and lid.

Figure 6B:
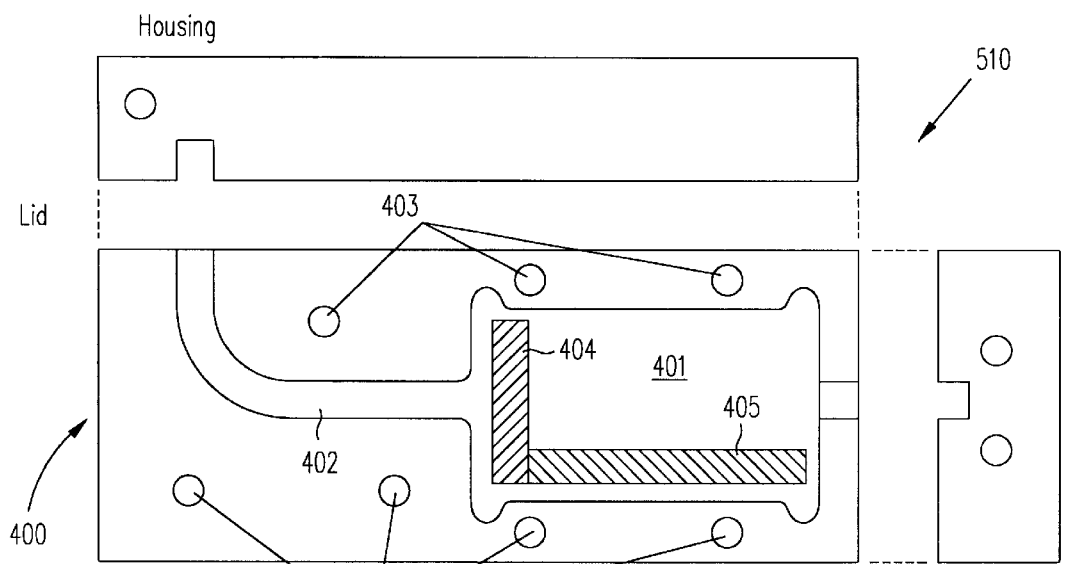
FIG. 6B shows a lid of the housing for the tripler/amplifier module and the placement of microwave absorbing material in a chamber of the lid for tuning of the microwave circuit.
Figure 6A:
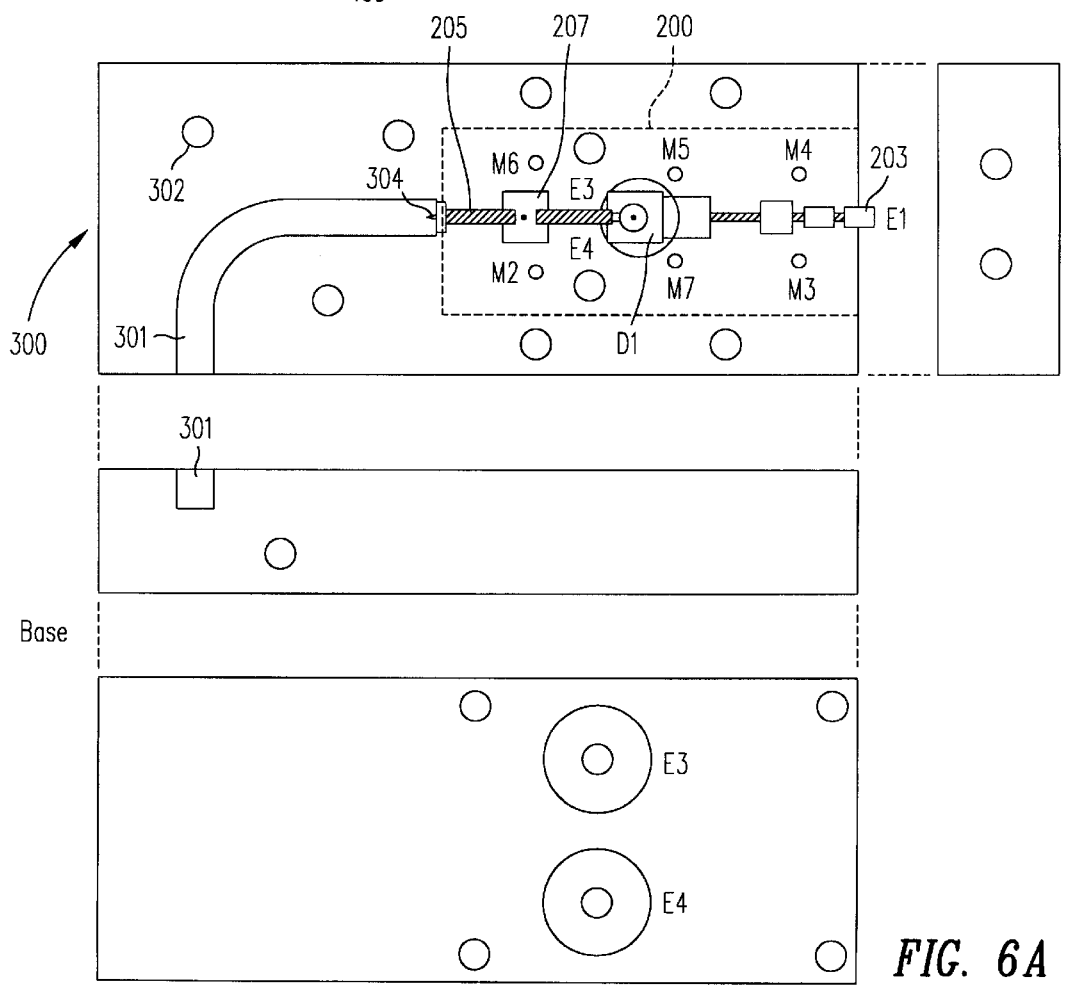
FIG. 6A shows a base of a housing for the tripler/amplifier module and the placement of the circuit board assembly shown in FIG. 4A on the base.

FIG. 6A shows a base 300 of the tripler/amplifier module on which the circuit board assembly 200 is mounted. In the preferred embodiment, the base 300 is constructed from aluminum. Any conducting material, however, may be used. Base 300 has access to allow connections to terminals E3, E4, and M2 through M from outside the tripler/amplifier module. Circuit board assembly 200 is mounted on base 300 such that the connections to the board (E3, E4, and M1 through M7) are aligned with the accesses in base 300. In FIG. 6A, the access in base 300 is shown with the respective electrical contacts from the microwave circuit assembly 200. Terminal E1 is coupled to a connector 303 for input signals and terminal E2 is coupled through a microstrip to waveguide impedance transformer 304 to a wave-guide channel 301.

In an exemplary embodiment, base 300 is 6.96 cm (2.740 inches) long, 2.743 cm (1.080 inches) wide and 1.118 (0.440 inches) thick. Wave-guide channel 301 is 3.43 mm (0.135 inches) deep and 3.56 mm (0.140 inches) wide. Connectors that are mounted on base 300 and used to electrically access the microwave circuit board assembly 200 mounted onto the base need not be sealed. However, some protection (i.e. to prevent electrical shorts or corrosion as a result of excessive moisture) for the microwave circuit assembly 200 is desirable.

FIG. 6B shows a lid 400 of the tripler/amplifier module 500. Lid 400 can be bolted to base 300 through a plurality of lid mounting holes 403 in lid 400 and a corresponding plurality of base mounting holes 302 in base 300. It is not necessary that lid 400 be connected to base 300 such that they are sealed, although some protection from excessive moisture is desirable. Chamber 401 in lid 400 provides clearance for microwave circuit assembly 200. Chamber 401 incidentally also affects the tuning of the microwave circuit. In addition, wave-guide channel 402 of lid 400 engages wave guide channel 301 of base 300 to form a millimeter-wave waveguide when lid 400 is attached to base 300.

In an exemplary embodiment, the length and width of lid 400 are identical with that of base 300. Lid 400 is 1.118 cm (0.128 inches) thick. Wave-guide channel 402 in lid 400 is 3.56 mm (0.140 inches) wide and 2.54 mm (0.100 inches) deep.

As a result of the presence of cap 207 in the microwave circuit assembly 200 and the need to tune the microwave circuit in the microwave circuit assembly 200, the depth of chamber 401 is adjusted and pieces of microwave absorbing material 404 and 405 can be affixed within chamber 401. A chamber 401 depth of 165 mils (0.165 inches) is found to optimize the tuning of the exemplary embodiment of the invention at 38 Ghz operation. Other operating bands may require other tuning arrangements. Pieces of microwave absorbing material 404 and 405 arranged as shown in FIG. 6B are found to further optimize the tuning of the microwave circuit. Microwave absorbing material 404 and 405 is 200 mils (0.2 inches) wide by 50 mils (0.05 inches) thick. Microwave absorbing material 404 is about 670 mils (0.670 inches) long and microwave absorbing material 405 is 1.04 inches long.

One skilled in the art will be capable of further modifications to the tripler/amplifier module preferred embodiment described above. Alternative methods of mounting lid 400 to base 300 are included. Another modification would be use of conducting materials other than aluminum for the housing (base 300 and lid 400) or copper for the conducting carrier 201. Some sealant may also be used to seal lid 400 to base 300 or to seal the various electrical connectors within the housing. Also, physical sizes can be modified.

The above example describing an embodiment of the invention is demonstrative only. The invention may be utilized in the production of other modules having environmentally sensitive components. In addition, variations obvious to one skilled in the art are within the scope of this application. Such variations include use of alternative materials for the cap and alternative methods of mounting the cap over the sensitive component. As such, this patent application is limited in scope only by the following claims.

We claim:

1. A method of protecting an environmentally sensitive component, comprising:

mounting the environmentally sensitive component to a circuit board assembly and electrically coupling the environmentally sensitive component to at least one component mounted on the circuit board assembly; and mounting a cap over the environmentally sensitive component such that the environmentally sensitive component is fully enclosed in an enclosure formed by the circuit board assembly and the cap, and where at least one of the at least one component mounted on the circuit board assembly is external to the enclosure.

2. The method of claim 1, wherein the cap is epoxied to the circuit board assembly.

3. The method of claim 2, wherein the cap is made from plastic.

* * * * *